United States Patent [19]
Ierfino

[11] Patent Number: 5,606,735
[45] Date of Patent: Feb. 25, 1997

[54] SLOPE EQUALIZER USING BASEBAND DETECTION

[75] Inventor: Nick Ierfino, Montreal, Canada

[73] Assignee: Harris Corporation, Melbourne, Fla.

[21] Appl. No.: 496,679

[22] Filed: Jun. 29, 1995

[51] Int. Cl.$^6$ ................................. H04B 1/10
[52] U.S. Cl. ............ 455/307; 455/234.1; 455/306; 455/308; 375/233; 375/345
[58] Field of Search .................. 455/234.1, 306, 455/307, 308, 303; 327/170; 375/229, 233, 235, 232, 345

[56] References Cited

U.S. PATENT DOCUMENTS

| | | | |
|---|---|---|---|
| 3,792,363 | 2/1974 | Gebel et al. ........................ | 328/164 |
| 4,245,353 | 1/1981 | Bynum ................................. | 455/266 |
| 4,403,351 | 9/1983 | Karabinis ............................. | 455/304 |
| 4,412,350 | 10/1983 | Miedema et al. .................... | 455/306 |
| 4,788,652 | 11/1988 | Bullock et al. ...................... | 364/602 |
| 5,222,255 | 6/1993 | Kuo et al. ............................ | 455/266 |

Primary Examiner—Reinhard J. Eisenzopf
Assistant Examiner—Tuyen Vu
Attorney, Agent, or Firm—Rogers & Killeen

[57] ABSTRACT

A device and method for correcting an amplitude slope in the frequency domain of an input signal. An amplitude slope is detected in parallel feedback loops that connect the combined output of two parallel out-of-band notch filters through a slope detection circuit to inputs of each of the two notch filters. Each feedback loop detects the energy at one of the high and low frequencies that define the frequency domain of the input signal, and provides a voltage indicative of the energy back to the notch filters to vary the Q of the notch filters, thereby correcting the amplitude slope. The energy is detected in each feedback loop by mixing the input signal with one of the high and low frequencies that define the frequency domain of the input signal, and filtering out all but the DC voltage indicative of the energy at the one frequency. The DC voltage changes the resistance of an element in the notch filters to vary Q.

9 Claims, 1 Drawing Sheet

SLOPE EQUALIZER USING BASEBAND DETECTION

BACKGROUND OF THE INVENTION

The present invention is directed to devices and methods for correcting atmospheric induced faults in a radio signal, and more particularly to a device and method for correcting an amplitude slope in a frequency domain of a digital radio signal.

Digital radios may operate in frequency bands that exceed 2 GHz. Most propagation conditions have little or no affect on the transmission of digital signals in this frequency band, but certain meteorological conditions, notably some temperature and humidity combinations, may produce multipath interference or reflective fading.

Multipath interference may cause a slope asymmetry in the frequency domain of the digital radio signal. For example, as shown in FIG. 1, the amplitude of the radio signal may vary in the frequency domain between lower frequency limit f1 and upper frequency limit f2 causing the amplitude to have a slope α. The desired amplitude slope is indicated by the dashed line.

As is known, the amplitude slope may be corrected by applying a slope correction to the radio signal. For example, signal amplitude at f1 and f2 may be sensed in filters set to f1 and f2. The sensed amplitude information may be used to control the Q of out-of-band low and high frequency filters, thereby adjusting the amplitude slope of the signal. However, the slope detection mechanism and subsequent adjustment may also change the amplitude of the output, and a further sensor for the amplitude of a mid-range frequency and a gain control mechanism for adjusting amplitude are needed. The further sensor and gain control mechanism increase complexity and cost of slope correction devices. Further, adjustment of the values of f1 and f2 is not convenient as new filters are required. See, for example, the device in U.S. Pat. No. 4,245,353 issued Jan. 13, 1981 to Bynum.

Accordingly, it is an object of the present invention to provide a novel device and method for correcting an amplitude slope in the frequency domain of a radio signal that is less complex and less costly than prior art devices, thereby obviating the problems of the prior art.

It is another object of the present invention to provide a novel device and method for correcting an amplitude slope in the frequency domain of an input signal in which a slope is detected using mixers in parallel feedback loops connecting an output signal to inputs to out-of-band high and low frequency notch filters, where each of the mixers combines the output signal with one of the high and low frequencies that define the frequency domain.

It is yet another object of the present invention to provide a novel device and method for correcting an amplitude slope in the frequency domain of an input signal in which parallel feedback loops each downconvert an output signal to a frequency that is an upper or lower limit of the signal frequency domain, and the energy in the downconverted signal is provided as a slope correction signal to one of parallel notch filters.

It is still another object of the present invention to provide a novel device and method for correcting an amplitude slope in the frequency domain of an input signal in which parallel feedback loops each downconvert an output signal to a frequency that is an upper or lower limit of the signal frequency domain, and in which the energy in the downconverted signal is sensed in a low pass filter which harnesses the energy and provides it as a slope correction to change the Q of parallel notch filters from which the output signal is provided.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
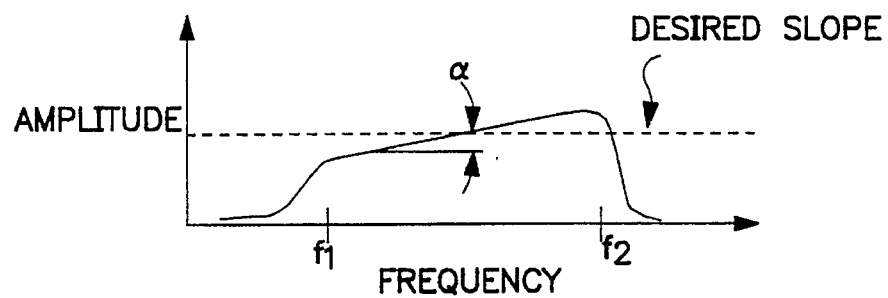
FIG. 1 is a graph of frequency versus amplitude illustrating a positive amplitude slope over the frequency domain of an input signal.
Figure 2:
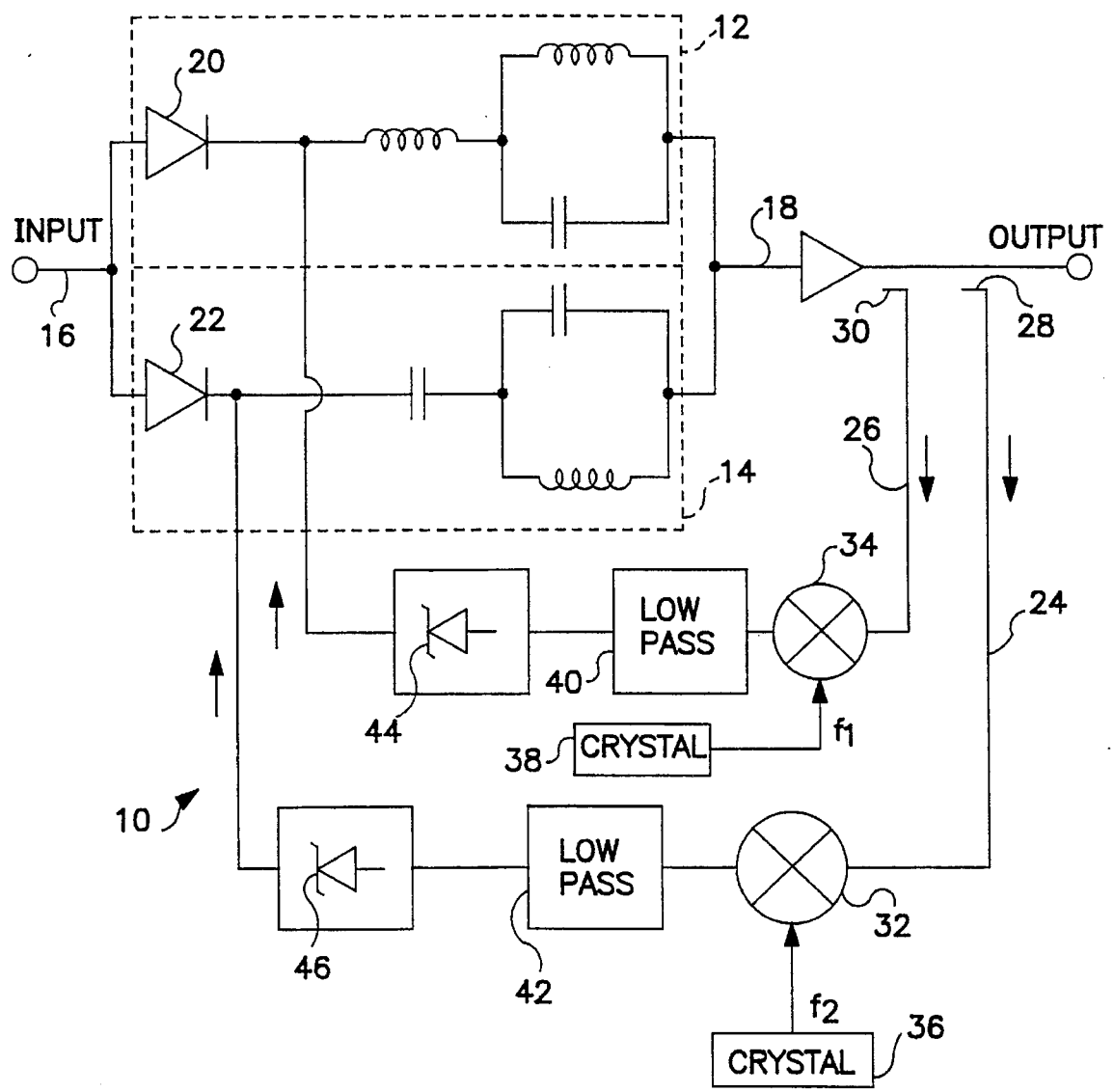
FIG. 2 is partial block and circuit diagram illustrating an embodiment of the present invention.

With reference now to FIG. 2, an embodiment 10 of the present invention may include two notch filters 12 and 14, one being the dual of the other, that are connected in parallel to receive an input signal 16 that may have an amplitude slope across its frequency domain, and to provide an output signal 18 that desirably has a near-zero, or at least substantially reduced amplitude slope. The amplitude slope of input signal 16 is controlled by the frequency responses of notch filters 12 and 14. The frequency responses of notch filters 12 and 14 may be controlled by operation of pin diodes 20 and 22 that act like variable resistors in filters 12 and 14. A change of resistance in pin diodes 20 and 22 changes Q of the respective notch filters 12 and 14 and thus changes the frequency response of notch filters 12 and 14. The amplitude slope is thus corrected by controlling the change in resistance of pin diodes 20 and 22. While it is desirable to provide slope correction signals which reduce the slope to zero, in practical application the present invention substantially reduces the slope, and typically the resulting slope is near zero.

Feedback loops 24 and 26 may provide slope correction signals to change the resistance of pin diodes 20 and 22 to correct an amplitude slope in input signal 16. Each of feedback loops 24 and 26 may sense output signal 18 at high impedance connections 28 and 30. Copies of output 18 are provided to mixers 32 and 34 for mixing output signal 18 with frequency f1 or f2 that define upper and lower limits of the signal frequency domain. The mixed signal is thus downconverted to f1 or f2. The frequencies f1 and f2 may be provided from crystals 36 and 38 that may be replaceable to reset f1 and f2 as desired.

The downconverted signal from mixers 32 and 34 may be provided to low pass filters 40 and 42 which provide DC voltages indicative of the energy at the frequency f1 or f2. Low pass filters 40 and 42 provide the voltage to Schottky diodes 44 and 46 for harnessing the DC voltage related to the energy from low pass filters 40 and 42 and sending the voltage as a slope correction to notch filters 12 and 14. The voltage from Schottky diodes 44 and 46 changes the resistance of pin diodes 20 and 22 to change the respective notch filter Q, thereby correcting an amplitude slope in the input signal frequency domain.

By way of further explanation, consider an example in which input signal 16 has a frequency of 70 MHz, and the frequency domain that desirably has zero slope is from 60 MHz (f1) to 80 MHz (f2). Notch filters 12 and 14 are desirably out of band about 1 MHz so that filter group delay does not offset output signal 18. Mixers 32 and 34 mix the entire 60–80 MHz spectrum to f1 and f2. Low pass filters 40 and 42 remove all but the DC voltage component of the mixed signal at f1 and f2 to thereby provide a voltage indicative of the energy at f1 and f2. For example, where f1 is 60 MHz, low pass filter 40 will cut off most of the spectrum which is folded over, harnessing only the energy around 60 MHz. This spectrum is converted at diode 44 and provided to notch filter 12. In notch filter 12, the voltage from diode 44 causes the resistance in pin diode 20 to change from its nominal value of about 300 ohms, thereby changing the Q of notch filter 12. When input signal 16 has no slope, the Q of each notch filter 12 and 14 does not change relative to the Q of the other notch filter so that there is no net change in output signal 18. When input signal 16 has a slope, the voltage from diodes 44 and 46 change the Q of notch filters 12 and 14 by an amount needed to realign the amplitude slope. It has been found that the embodiment of FIG. 2 can correct an amplitude slope by up to about 15 dB across a 20 MHz frequency domain.

Inclusion of filters 40 and 42 may mean that the group delay is not minimized. As will be appreciated by those of skill in the art, compensation may be provided by finding the reciprocal of the calculated filters.

In a preferred embodiment, low pass filters 40 and 42 may be conventional, simple, low pass filters. Similarly, mixers 32 and 34 may be conventional, simple, mixers such as the Harris Corporation NE602.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A device for correcting an amplitude slope across a frequency domain of a radio signal comprising:

two filters connected in parallel, each for receiving an input signal with an amplitude slope across its frequency domain, wherein a combined output from said two filters is an output signal;

each of said two filters comprising a first diode for changing its filter's Q responsive to an input voltage; and two feedback loops, each for communicating an amplitude slope correction to a different one of said two filters, each of said two feedback loops comprising,
 a mixer for downcoverting a copy of the output signal to one of two frequencies that define upper and lower limits of the frequency domain,
 a low pass filter for indicating energy at one of the upper and lower limits of the frequency domain in the downcoverted copy of the output signal, and
 a second diode for providing the input voltage to one said first diode responsive to the energy indicated by said low pass filter, whereby the amplitude slope in the input signal is corrected by the changed Q of said two filters.

2. The device of claim 1 wherein each said mixer comprises a replaceable crystal for setting the upper and lower limits of the frequency domain.

3. The device of claim 1 wherein said second diode comprises a Schottky diode.

4. The device of claim 1 wherein said two filters are notch filters.

5. A device for correcting an amplitude slope in an input signal comprising:

first means for controlling an amplitude slope in an input signal;

parallel feedback means for providing an output from said first means to a pair of slope correction means, each of said slope correction means comprising,
 a mixer for converting the input signal to one of two boundary frequencies between which the amplitude slope is measured, and
 means for providing a voltage indicative of the energy at the boundary frequencies to said first means, the voltage causing said first means to reduce the amplitude slope.

6. The device of claim 5 wherein each said slope correction means further comprises a crystal for providing one the two boundary frequencies to said mixer.

7. The device of claim 5 wherein each said feedback means comprises a high impedance connection between the output from said first means and said mixer.

8. The device of claim 5 wherein said first means comprises parallel notch filters, each with a resistive element whose resistance varies responsive to the voltage from said means for providing.

9. A method for correcting an amplitude slope across a frequency domain of a digital radio signal comprising the steps of:

(a) providing an input digital radio signal to two filters connected in parallel, the input digital radio signal having an amplitude slope across its frequency domain;

(b) combining outputs from the two filters as an output radio signal;

(c) providing a separate feedback loop for each of the two filters, each feedback loop communicating an amplitude slope correction to one of the two filters; and (d) in each feedback loop,
 (i) downcoverting a copy of the output radio signal to one of two frequencies that define upper and lower limits of the frequency domain,
 (ii) low pass filtering the downconverted copy to provide a voltage indicative of the energy at the one of the two frequencies, and
 (iii) providing an amplitude slope correction to an input of one of the two filters responsive to the energy indicated by the low pass filter, whereby the amplitude slope in the input digital radio signal is corrected.

\* \* \* \* \*